US009160378B2

(12) United States Patent
Zhang et al.

(10) Patent No.: US 9,160,378 B2
(45) Date of Patent: *Oct. 13, 2015

(54) CONTROL METHOD AND EQUIPMENT FOR RADIO-FREQUENCY SIGNAL

(71) Applicant: Comba Telecom Systems (China) Ltd, Guangzhou (CN)

(72) Inventors: Zhansheng Zhang, Guangzhou (CN); Shuanlong Pan, Guangzhou (CN)

(73) Assignee: Comba Telecom Systems (China) Ltd (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/240,564

(22) PCT Filed: Apr. 12, 2013

(86) PCT No.: PCT/CN2013/000419
§ 371 (c)(1),
(2) Date: Feb. 24, 2014

(87) PCT Pub. No.: WO2013/170623
PCT Pub. Date: Nov. 21, 2013

(65) Prior Publication Data
US 2014/0233676 A1    Aug. 21, 2014

(30) Foreign Application Priority Data

May 16, 2012    (CN) .......................... 2012 1 0152461

(51) Int. Cl.
*H04B 1/04*    (2006.01)
*H03G 3/30*    (2006.01)

(52) U.S. Cl.
CPC ........... *H04B 1/0475* (2013.01); *H03G 3/3042* (2013.01); *H03G 3/3047* (2013.01); *H04B 2001/0416* (2013.01); *H04B 2001/0425* (2013.01)

(58) Field of Classification Search
CPC .............................................. H04B 2001/0416
USPC ......................................................... 375/297
See application file for complete search history.

(56) References Cited

U.S. PATENT DOCUMENTS

2004/0235436 A1*  11/2004  Chao et al. .................... 455/126
2008/0261534 A1*  10/2008  Wang et al. ................ 455/67.11
2014/0233677 A1*   8/2014  Zhang et al. .................. 375/297

FOREIGN PATENT DOCUMENTS

| CN | 1140931   A | 1/1997  |
| CN | 101257319 A | 9/2008  |
| CN | 101576999 A | 11/2009 |
| CN | 102427437 A | 4/2012  |

OTHER PUBLICATIONS

International Search Report for Application No. PCT/CN2013/000419 dated Jul. 18, 2013.

* cited by examiner

*Primary Examiner* — Michael Neff
(74) *Attorney, Agent, or Firm* — Lerner, David, Littenberg, Krumholz & Mentlik, LLP

(57) ABSTRACT

The present invention describes a RF signal control method and device that changes the gain attenuation in real time and uses the changed gain attenuation to adjust the RF input signal. The RF signal control method and device also uses determined linear filter parameters for linearity improvement on the digital signal that results from a down-conversion and analog-to-digital converter on the RF input signal. The adjusted and improved signal is output after a digital pre-distortion and power amplification operation. In comparison with existing technologies, the adjusted gain attenuation is used to make adjustment on the RF input signal and improve linearity the RF input signal such that the resulting RF signal has better quality. Thus, the current application improves the linearity effect of a digital pre-distorter and the dynamic effect of a power amplifier for the RF signal, thereby enhancing coverage of the RF output signal.

23 Claims, 7 Drawing Sheets

CONTROL METHOD AND EQUIPMENT FOR RADIO-FREQUENCY SIGNAL

CROSS-REFERENCE OF RELATED APPLICATIONS

The present application is a national phase entry under 35 U.S.C. 0371 of International Application No. PCT/CN2013/000419 filed Apr. 12, 2013, which claims priority from Chinese Patent Application No. 201210152461.1, filed May 16, 2012, all of which are incorporated herein by reference.

FIELD OF INVENTION

The present invention relates to the field of mobile communication. Specifically, the present application describes a method and device for controlling Radio Frequency (RF) signals.

BACKGROUND OF THE INVENTION

The communication spectrum is becoming a more and more precious resource as a result of rapid development of global communication services. Aiming to use spectrum resources more effectively, modulation systems of high spectral efficiency, such as quadrature phase shift keying (QPSK) and quadrature amplitude modulation (QAM), have adopted in communication systems to modulate phase and amplitude of carriers, which results in non-constant envelope modulated signals of large peak-to-average ratio (PAR). Even multi-carrier technology is being used for such non-constant envelope modulated signals. However, large PAR cannot be avoided during multicarrier synthesis, which results in poor linearity performance. Better linearity performance of transmitters leads to less interference between different equipment within the communication network and between carriers of different frequency on the same equipment. Thus, better linearity performance results in higher utilization of communication spectrum resources. As a result, there are higher demands for the linear adjustment of power amplifiers, which are the core component in determining linearity performance of signals in transmitters.

As the development of digital technologies and RF technologies grows, the solution to the linear adjustment issue of power amplifiers is to adopt digital pre-distortion technology. FIG. 1 shows a popular digital pre-distortion power amplifier system, that includes an I/Q baseband signal input port, a baseband data processor, a baseband signal clipping equipment, a baseband pre-distortion processor, a pre-distortion parameter adapter, a baseband data processor, a digital-to-analog (D/A converter, an analog-to-digital (A/D) converter, up-converter equipment, local oscillator equipment, down-converter equipment, a power amplifier, a coupler and an RF output port.

As shown in FIG. 1 the received I/Q baseband signals undergoes pre-distortion processing. In this regard I/Q baseband signals are received at the I/Q baseband signal input port and processed by the baseband data processor and the baseband signal clipper equipment, which results in digital baseband signals with a lower PAR.

The digital baseband signals of lower PAR go through the baseband pre-distortion processor, D/A converter, and up-converter equipment to become post-pre-distortion RF signals. The post-pre-distortion RF signals are then amplified through the high-power amplifier and output through the RF output port. To monitor the system linearity in real time, some RF signals are picked to go through the coupler at the RF output port. From the coupler, the RF signals go through the down-converter and A/D converter to become digital feedback baseband signal. After going through the baseband data processor and pre-distortion parameter adaptor control equipment, the signal implements the linearity adjustment on the lower-PAR digital baseband signal received by the baseband pre-distortion processor, which results in optimal linearity adjustment of the pre-distortion power amplifier system.

The digital pre-distortion system as shown in FIG. 1 can realize the linear requirements by passing the received I/Q baseband signals through the pre-distortion power amplifier system. However, the I/Q baseband signal input port used in the digital pre-distortion power amplifier system shown in FIG. 1 can only be used in certain equipment, such as base stations and remote radio units (RRU). It is impossible to use an RF port as the input port in the pre-distortion power amplifier system. This is problematic since a large portion of the communication equipment used to provide current communication network coverage use an RF port as signal input port Based on the solution shown in FIG. 1, FIG. 2 illustrates an RF input port that has been developed.

The digital pre-distortion power amplifier system of FIG. 2 includes an RF signal input port, a first down-converter, a first local oscillator, a first A/D converter, a digital down-converter and filter processor, baseband signal clipping equipment, a baseband pre-distortion processor, a pre-distortion parameter adaptation controller, a baseband data processor, a D/A converter, a second A/D converter, an up-converter, a second local oscillator, a second down-converter, a power amplifier, a coupler and an RF output port.

As shown in FIG. 2, the digital pre-distortion power amplifier system that includes the RF input port performs the same basic processing theories on received signals as the digital pre-distortion power amplifier system that is based on the I/Q baseband signal input port. The digital pre-distortion power amplifier of FIGS. 1 and 2 only differ in terms of the type of signal input port. Because of the different signal input ports, different kinds of signals are processed in the pre-distortion operation (e.g., a digital baseband signal in the case of an I/Q baseband signal input port versus an RF signal in the case of an RF input port). In comparing the two systems, the signal performance, such as signal frequency and signal quality, in the system using the digital baseband signal is superior to the system using the RF signal.

Moreover, in the pre-distortion power amplifier system shown in FIG. 2, the RF signals are processed jointly by the first down-converter and first local oscillator after being received through the RF input port, and then by the first A/D converter. If the pre-distortion power amplifier system shown in FIG. 2 is used for the pre-distortion treatment of the received RF signals, the signal linearity will be rather poor when the pre-distortion-treated signals are output through the power amplifier since the RF signals are received through the RF input port and have lower signal quality than the digital baseband signal. That may cause signals of bad quality in the coverage area and affect the normal operation of a communication network.

SUMMARY OF THE INVENTION

The present invention provides a RF signal control method and device to solve the issue of poor signal quality after performing pre-distortion on RF signals received in a pre-distortion power amplifier system.

In one embodiment, an RF signal control method includes identifying a parameter information of an input RF signal, wherein said parameter information is used to characterize the power of RF signal. After the parameter information is identified, the method determines an input power value corresponding to the parameter information of the input RF signal according to a mapping relationship between the RF signal parameter information and input power value. When the input power value is lower than a rating power, the current gain attenuation value is adjusted.

The input RF signal is adjusted using the adjusted gain attenuation value and then outputted.

Another embodiment describes an RF signal control method that includes determining the first center frequency and bandwidth of the digital signal that is generated through the down-conversion and A/D conversion on the input RF signal. Then, a second center frequency of the working band required by the power amplifier is determined according to the start frequency and stop frequency of the power amplifier.

Using the difference between the first and second center frequency and the digital signal bandwidth value as the parameters for the linear filter the method generates outputs through digital pre-distortion and power amplifier operations.

According to another embodiment there is an RF signal control device that includes an RF power detector configured to identify aparameter information of an input RF signal, wherein said parameter information is used to characterize the power of the input RF signal. The RF signal control device also includes an adaptation controller, configured to determine the input power corresponding to the parameter information of the input RF signal, as determined by the RF power detector according to the mapping relationship between the RF signal parameter information and input power value. The adaptation controller is further configured to adjust the current gain attenuation value when it decides that the input power is below the rating power and to send the adjust gain attenuation value to the gain adjuster.

The gain adjuster is configured to adjust and output the input RF input signal using the decreased gain attenuation value.

According to yet another embodiment, an RF signal control device includes an adaptation controller configured to determine the first center frequency and the bandwidth of the digital signal that is generated through the down-conversion and A/D conversion of the input RF signal. The adaptation controller is further configured to determine a second center frequency of the working band required by the power amplifier according to the start frequency and stop frequency of the power amplifier.

The RF signal control device also includes a linear filter configured to use the difference between the first and second center frequency and the digital signal bandwidth value, as determined by the adaptation controller, as the parameters for the linear filter.

Next, a digital pre-distorter configured to use a digital pre-distortion operation on the signal after the adjustment by the linear filter.

Finally, an RF power amplifier is configured to perform power amplification and output the digital signal after the pre-distortion operation.

The embodiments of the present has application have the benefits of improving linearity performance of the digital signal after the RF signal goes through the down-converter and the A/D converter by adjusting the RF input signal with the decreased gain attenuation value and/or linearity improvement on the RF input signal so that the resulting RF signal has better quality than the one through simple A/D converter and clipping operations. Thus, the described embodiments promote the linearity effect with digital pre-distortion treatment and the dynamic effect of power amplifier on the RF signals, thereby enhancing the coverage of output signals.

DETAILED DESCRIPTION OF THE INVENTION

For the purpose of this invention, an RF signal control method and device are described that implement a real-time change on gain attenuation value and adjust the RF input signal by using the changed gain attenuation value. The RF signal control method and device of the current invention perform linearity improvement according to the determined linear filter parameters on the digital signal that are generated from the down-conversion and A/D conversion on the RF input signal. The adjusted and/or improved signal are passed through digital pre-distortion and power amplification operations.

Compared with the prior art, the current invention achieves adjustment of the RF input signal with the decreased down-converter gain attenuation value and/or linearity improvement of the RF input signal such that the resulting RF signal has better quality than the one passed through simple A/D converter and clipping operations. Thus, the current invention improves the linearity effect with digital pre-distortion treatment and the dynamic effect of the power amplifier on the RF signals, thereby enhancing the coverage of the output signals.

In conjunction with the appended figures, the embodiments of the current invention are described in detail below.

Figure 1:
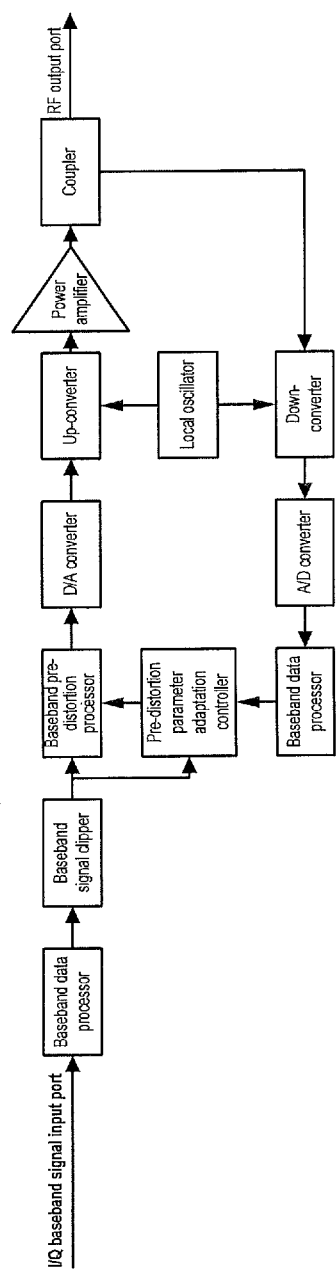
FIG. 1 is a schematic of a common digital pre-distortion power amplifier system.
Figure 2:
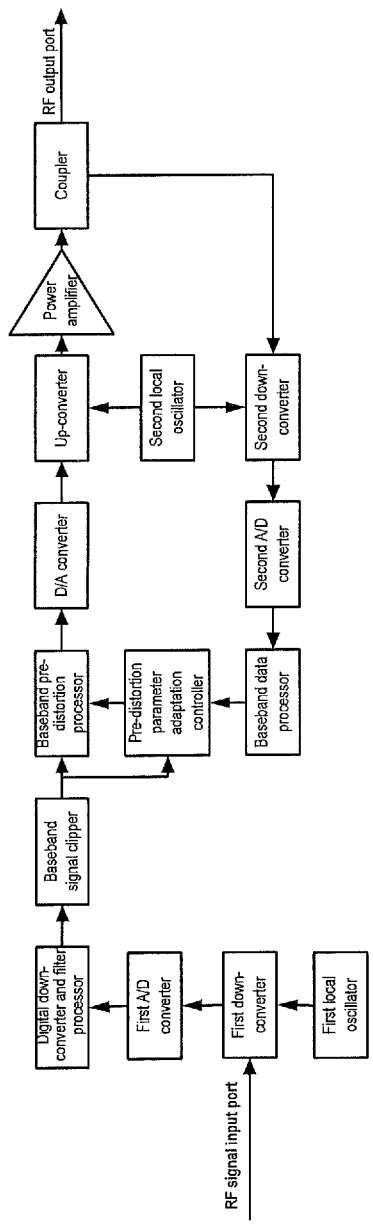
FIG. 2 is a schematic of the common digital pre-distortion power amplifier system with an RF input port.
Figure 3:
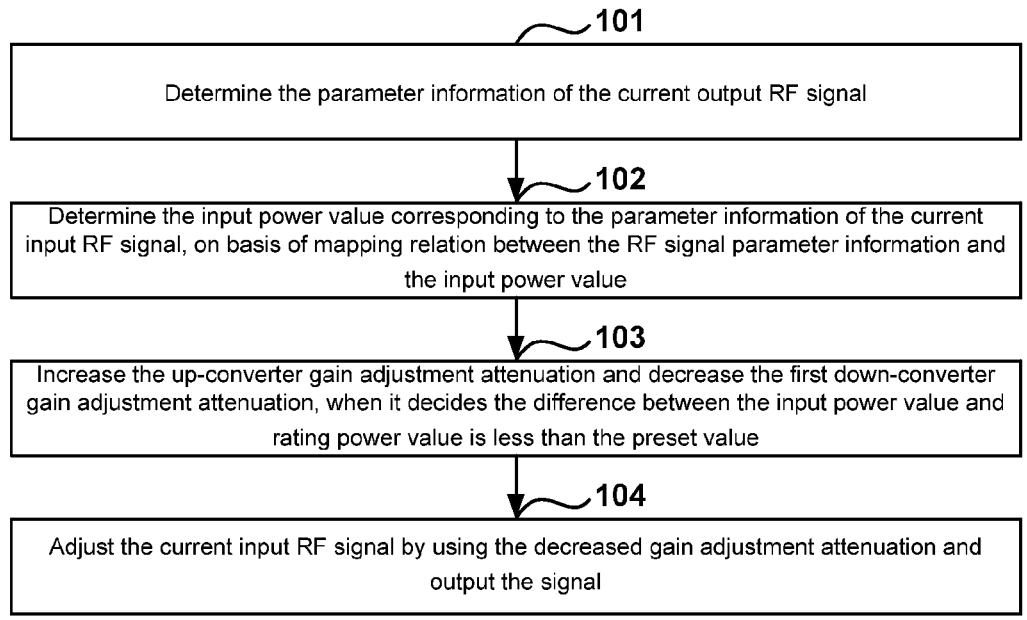
FIG. 3 is a flowchart for controlling the RF signal control according to one embodiment of the present invention.

Referring to FIG. 3, a method of controlling the RF signal according to one embodiment is illustrated.

The method begins at step 101, which determines the parameter information of the RF input signal.

The parameter information is used to characterize the power of the input RF signal, which can be the voltage or current of the input RF signal.

In step 101, the RF input signal is extracted at the RF input port via a coupler.

The extracted input RF signal is used to generate the voltage/current of the input RF signal through the voltage/current detector.

Step 102 proceeds to determine the input power value corresponding to the parameter information of the input RF signal according to a mapping relationship between the input RF signal parameter information and the input power value.

In Step 102, if the parameter information of the input RF signal is the voltage of the input RF signal, the mapping relationship between the voltage of the said RF signal and the output power is determined and may be stored locally in a table. If the parameter information of the input RF signal is the current of the input RF signal, the mapping relationship between the current of the input RF signal and the input power is determined and may be stored locally in a table.

Once the voltage/current of the input RF signal is determined, the mapping relationship of the voltage/current and input power in the table is used to decide the corresponding input power. It is also possible to establish the linear mapping relationship between the voltage/current and input power of the input RF signal, and decide the corresponding input power of the input RF signal according to the voltage/current of the input RF signal on basis of the linear relationship.

The current gain attenuation value is adjusted in step 103 when it is decided that the input power is lower than the rating power.

In step 103, whether the said power is lower than the rating power is decided. If it is, the current gain attenuation value is adjusted; if not, the current gain attenuation value remains unchanged.

If the current gain attenuation includes analog gain attenuation, it uses the difference between the input power and the rating power corresponding to the determined parameter information and the pre-set mapping relationship between the difference and analog gain attenuation decrement to decide the decrement of the analog gain attenuation value. Thus, the current analog gain attenuation value is decreased by the amount of the determined decrement to result in a new analog gain attenuation value.

In the case where the analog gain attenuation decrement is equal to the difference, the difference between the input power corresponding to the said voltage and the rating power is used, thereby producing the difference value for the decrement of analog gain attenuation, and decreases the current analog gain attenuation value by that amount.

If the current gain attenuation also includes digital gain attenuation, the difference between the input power and the rating power corresponding to the determined parameter information is used. The increment of the digital gain attenuation value is determined according to the determined difference between the pre-set mapping relationship and digital gain attenuation increment and used to increase the current digital gain attenuation value by an amount of the determined increment to produce a new digital gain attenuation value.

Since the digital gain attenuation value contains phase an I-channel gain attenuation value and an orthogonal Q-channel gain attenuation value, the difference between the pre-set mapping relationship and digital gain attenuation increment value may have a one-to-one relationship. In this scenario, the increments for the phase I-channel gain attenuation value and quadrature Q-channel gain attenuation value of the digital gain attenuation are $1\sqrt{2}$ of the difference, respectively. Based on the difference between the input power corresponding to the input voltage and the rating power, the phase I-channel gain attenuation value and quadrature Q-channel gain attenuation value of the digital gain attenuation are increased by $1\sqrt{2}$ of the determined difference, respectively.

During Steps 101 through 103, it is possible to sample the input RF signal to get the input power. The voltage/current of the sampled RF signal is determined, and then the gain adjustment attenuation value is changed such that the changed gain attenuation value is used for an accurate adjustment on the input RF signal.

In step 104, the input RF signal is adjusted using the adjusted gain attenuation value and then outputted.

In step 104, the gain attenuation value includes both an analog gain attenuation value and a digital gain attenuation value. The specific adjustment method by using the adjusted gain attenuation value for the input RF signal includes using the new analog gain attenuation value for analog gain adjustment on the input RF signal first.

Next, down-conversion and A/D conversion is performed on the input RF signal after the analog gain adjustment to produce a digital signal.

Finally, the new digital gain attenuation value is used for an adjustment on the digital signal.

Note that the new digital gain attenuation is used for adjustment on the digital signal, and then digital pre-distortion operation and power amplification are done before the output.

With respect to this embodiment, the input power corresponding to the determined parameter information of the RF input signal is compared with the rating power to make adjustment on the gain attenuation value. This method eliminates the problem of poor output signal quality due to the A/D conversion bit limitation with existing technologies. Furthermore, the method of this embodiment improves the performance of existing digital pre-distortion power amplifier systems and increases the dynamic output range.

Figure 4:
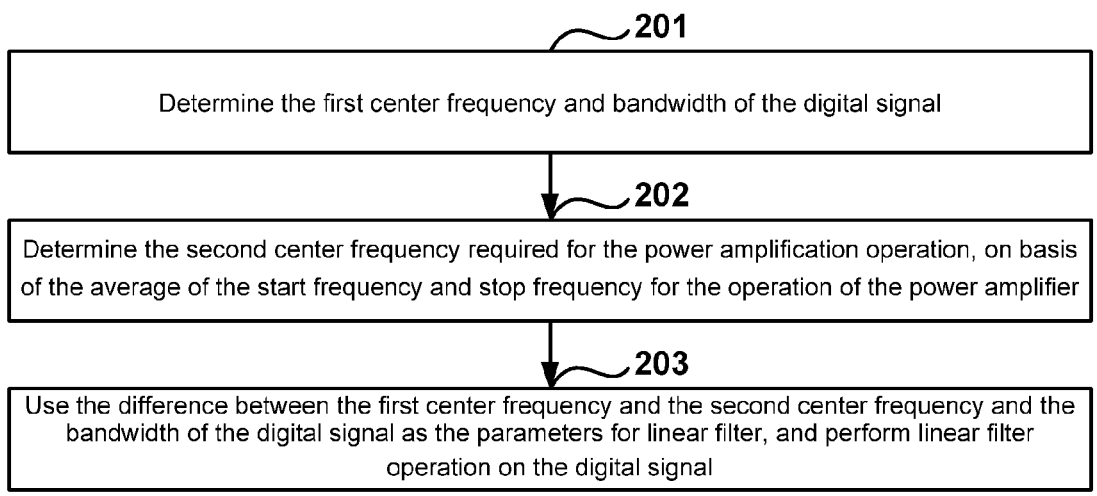
FIG. 4 is a flowchart for controlling the RF signal control according to a second embodiment of the present invention.

FIG. 4 shows the workflow of the RF signal control method according to another embodiment of the invention. Similar to the previously discussed embodiment, this embodiment has a further linear filter adjustment on the digital signal that is produced through the down-conversion and A/D conversion on the analog-gain-adjusted RF signal, before the digital signal is adjusted using the new digital gain attenuation value.

Figure 5:
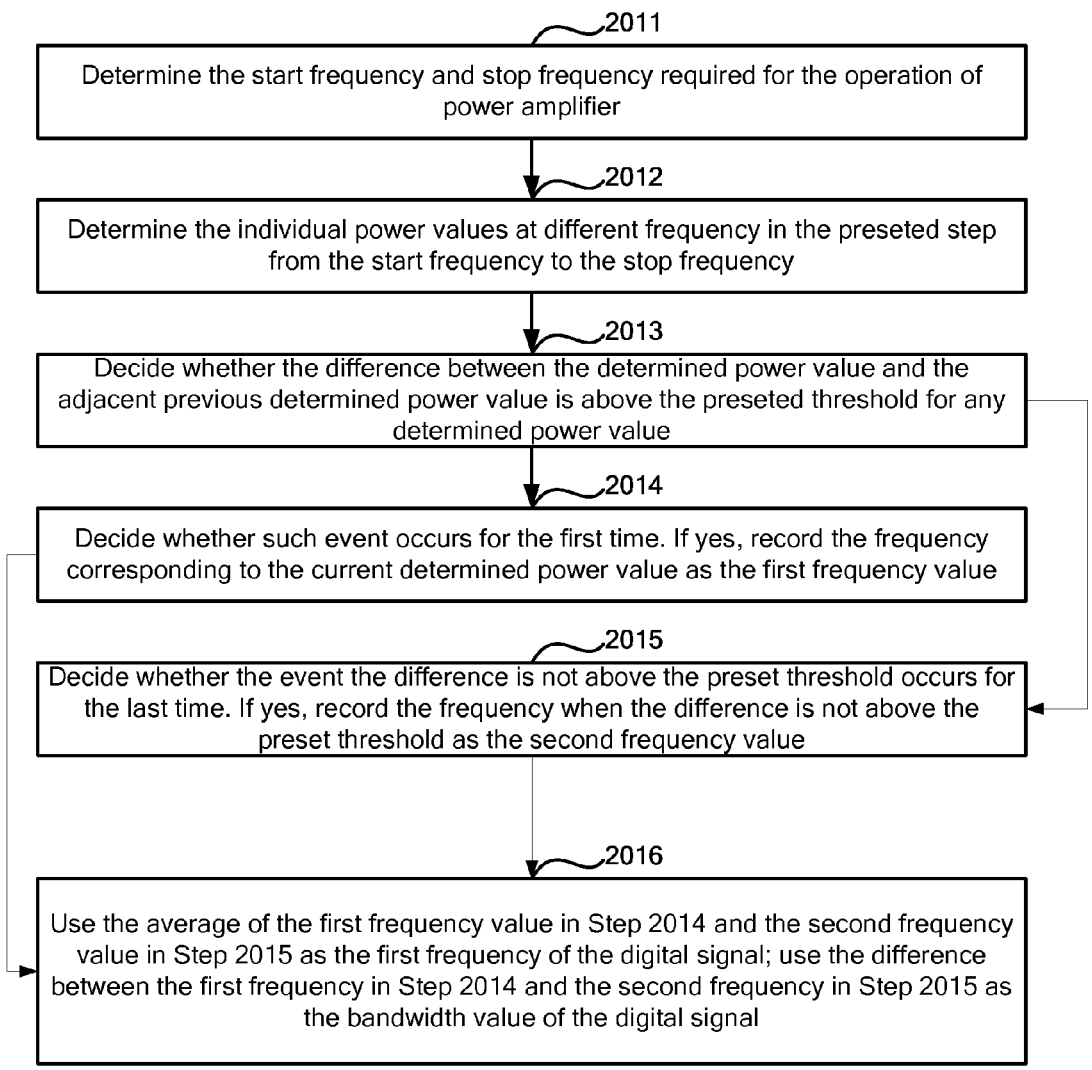
FIG. 5 is a flowchart of the method for determining the first center frequency and a bandwidth of a digital signal.

The method begins at Step 201, by determining the first center frequency and the bandwidth of the digital signal. In Step 201, the digital signal results from the down conversion and A/D conversion on the RF signal after the analog gain adjustment. FIG. 5 shows a flowchart for determining the first center frequency and the bandwidth of digital signal. Specifically, step 2011 determines the start frequency and stop frequency as required for the operation of power amplifier.

Note that the determined start frequency and stop frequency are the working frequency of the RF power amplifier in case the power amplification is implemented by a RF power amplifier.

In step 2012, power values of the digital signal at different frequencies (in steps) are determined from the start frequency to the stop frequency.

Specifically, different frequencies are selected in pre-set steps from the start frequency. At any determined frequency, a fixed point count of the digital signal is used, and then the power value of the digital signal at the determined frequency is calculated according to the following equation:

$$P = \frac{1}{N} \sum_{n=1}^{N} (I_n^2 + Q_n^2)$$

Here, P is the power value of the digital signal at the determined frequency step, N is the fixed point count of the digital signal, $I^2+Q^2$ is the power value of the digital signal at any frequency step, where I indicates the in-phase of the digital signal and Q indicates the quadrature of the digital signal.

For example, that the fixed point count N can be 4096 and the step can be 200 kHz.

In step 2013, the difference between the determined power value and the adjacent previous determined power value is determined. If the difference is greater than the pre-set threshold, the method proceeds to step 2014; if not, the method goes to step 2015.

Note that the pre-set threshold can be an imperial value or a value as required, such as 10 dB.

If the difference between this determined power value and the adjacent previous determined power value is greater than the pre-set threshold, step 2014 decided whether such event occurs for the first time. If yes, the frequency corresponding to this determined power value is recorded as the first frequency.

In step 2014, the steps to determine the first frequency are as below:

Step a: Decide whether the difference between this determined power value and the adjacent previous determined power value is greater than the pre-set threshold. If yes, proceed with the next step; otherwise, go to Step 2015.

Step b: Decide whether the event that the difference is greater than the threshold occurs for the first time. If yes, record the frequency corresponding to this determined power value as the first frequency; otherwise, increase the count of the event by 1, and record the mapping relationship between the frequency corresponding to this determined power value and the changed counts.

If the difference between this determined power value and the adjacent previous determined power value is not greater than the pre-set threshold, step 2015 decides whether such event occurs for the last time. If yes, record the frequency when the difference is not greater than the threshold as the second frequency.

In step 2015, the steps to determine the second frequency are as below:

Step a: Decide whether the difference between this determined power value and the adjacent previous determined power value is greater than the pre-set threshold. If yes, go to step 2014; otherwise, proceed with the next step.

Step b: Increase the count of events that the difference is not greater than the threshold by 1. Record the mapping relationship between the frequency corresponding to this determined power and the changed count.

Step c: Decide whether the difference is not greater than the threshold occurs for the last time. If yes, record the frequency corresponding to this determined power value as the second frequency.

In step 2016, the average of the first frequency in Step 2014 and the second frequency in Step 2015 is used as the first center frequency of the digital signal. The difference between the first frequency in Step 2014 and the second frequency in Step 2015 is used as the bandwidth of the digital signal.

In step 202, the second center frequency of the working band required by the power amplifier is determined according to the average value of the start frequency and stop frequency required by the power amplifier.

Step 203 uses the difference between the first and second center frequency and the digital signal bandwidth value as the parameters to implement the linear filter on the digital signals.

According to this embodiment, the RF signal after the analog gain adjustment is processed in the down-converter and A/D converter. The resulting digital signal passes through linear filter by using the determined linear filter parameters to improve signal quality such that the RF signal output after the digital pre-distortion and power amplification operation has better coverage effect, thereby enhancing the communication quality of the coverage signal.

Note that this embodiment can be used directly without previously discussed embodiments. The input RF signal is processed with the down-converter and A/D converter. The resulting digital signal passes through the linear filter using the determined linear filter parameters. The signal quality of the input RF signal can also be improved such that the output digital signal processed with the linear filter, and then passing through digital pre-distortion and power amplification operations, provides better RF signal coverage effect than existing technologies, thereby enhancing signal coverage quality.

Figure 6:
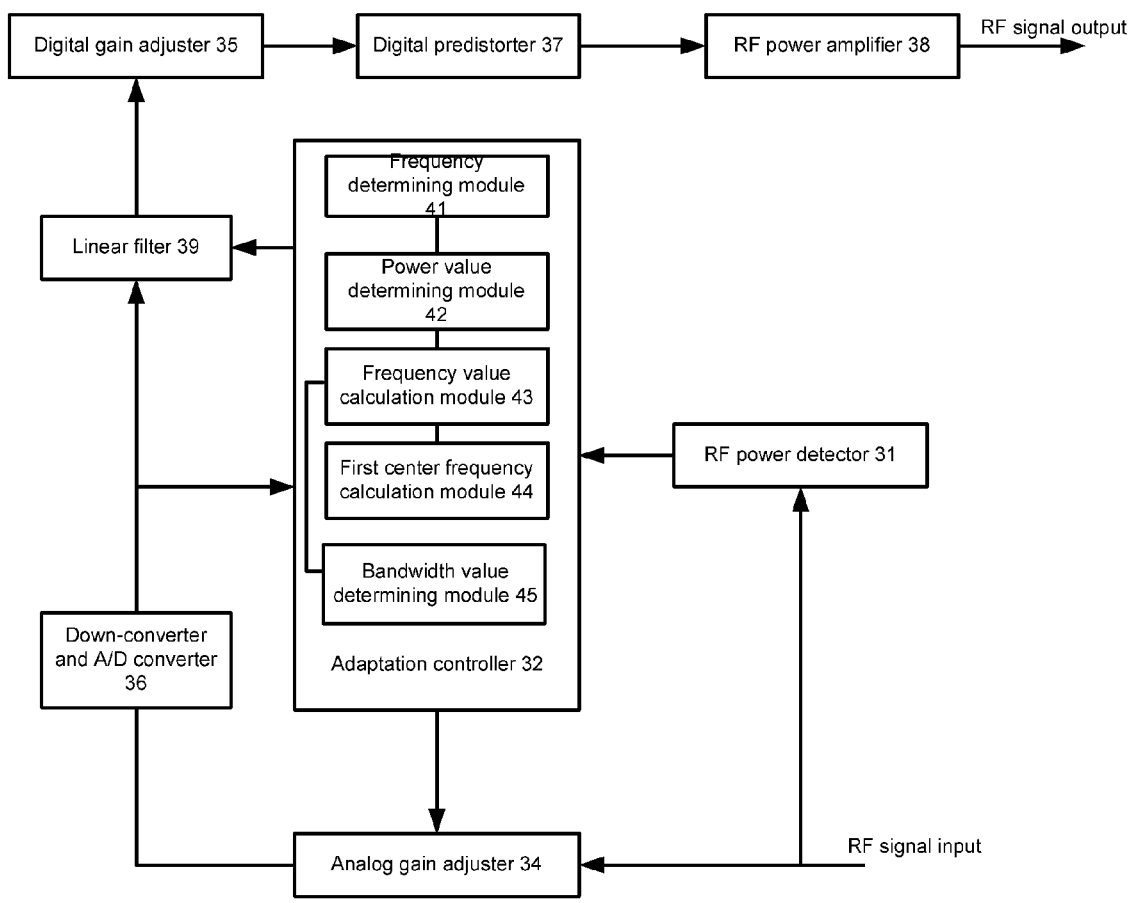
FIG. 6 is a schematic of the structure of the RF signal control device according to one embodiment of the current invention.

FIG. 6 illustrates the structure of the RF signal control device according to another embodiment. This embodiment describes a control device that is capable of performing the RF signal control method discussed in the previous embodiment. The device includes a RF power detector 31, an adaptation controller 32, and a gain adjuster.

The RF power detector 31 is used for identifying the parameter information of the input RF signal, wherein the parameter information is used to characterize the power of RF signal.

The adaptation controller 32 is used to determine the input power corresponding to the parameter information of the RF input signal as determined by the RF power detector according to a mapping relationship between the RF signal parameter information and input power value. The adaptation controller 32 also adjusts the current gain attenuation value when it decides the input power value is below the rating power and send the adjust gain attenuation value to the gain adjuster.

The gain adjuster is used to adjust and output the RF input signal by using the adjusted gain attenuation value.

Specifically, the gain adjuster includes an analog gain adjuster 34 and a digital gain adjuster 35.

The adaptation controller 32 is also used to determine the difference between the input power value corresponding to the parameter information and the rating power (when the gain adjuster includes the analog gain adjuster). Additionally, the adaptation controller 32 uses the difference between the pre-set mapping relationship and the decrement of the analog gain attenuation value to determine the analog gain attenuation decrement value. Thus, the new analog gain attenuation value is determined from the current analog gain attenuation value.

The RF signal control device also includes the down-converter and A/D converter 36.

Specifically, the adaptation controller 32 is used to determine the difference between the input power value corresponding to the parameter information and the rating power (when the gain adjuster includes the digital gain adjuster), and use the pre-set mapping relationship between the difference and the increment of digital gain attenuation value to determine the digital gain attenuation increment value. The digital gain attenuation increment value corresponds to the difference. Thus, the new digital gain attenuation value is determined from the current digital gain attenuation.

Analog gain adjuster 34 is used for the analog gain adjustment on the RF input signal by using the new analog gain attenuation value.

Down-converter and A/D converter 36 is used for the down-conversion and A/D conversion on the signal after the analog gain adjustment with the analog gain adjuster 34 to produce the digital signal.

Digital gain adjuster 35 is used for an adjustment on the digital signal resulting from the down-converter and A/D converter 36 by using the new digital gain attenuation The RF signal control device also includes the digital pre-distorter 37 and RF power amplifier 38.

Digital pre-distorter 37 is used for a digital pre-distortion operation on the signal resulting from the digital gain adjuster 35.

RF power amplifier 38 is used for power amplification and output of the signal resulting from the digital pre-distortion operation of the digital pre-distorter 37.

The adaptation controller 32 is also used to determine the first center frequency and bandwidth of the digital signal after the down-conversion and A/D conversion to result in a digital signal before the adjustment of the digital signal using the digital gain adjuster 35. The adaptation controller 32 is also used to determine the second center frequency of the RF power amplifier working band according to the average of the start frequency and stop frequency as required for the operation of the power amplifier 38.

The monitor controller 32 further comprises a frequency determining module 41, a power determining module 42, a frequency value determining module 43, a first center frequency calculation module 44, and a bandwidth determining module 45.

The frequency determining module 41 is used to determine the start frequency and stop frequency required for the power executions.

Power determining module 42 is used to determine the power values of the digital signals at different frequencies in steps from the determined start frequency to stop frequency.

Frequency determining module 43 is used to perform the following operations for the determined power values:

If the difference between the determined power value and the adjacent previous determined power value is greater than the pre-set threshold, the power determine module 43 decides whether such event occurs for the first time. If yes, the frequency when the difference is greater than the threshold is recorded as the first frequency.

If the difference between the determined power value and the adjacent previous determined power value is not greater than the pre-set threshold, the power determining module 43 decides whether such event occurs for the last time. If yes, the frequency when the difference is not greater than the threshold is recorded as the second frequency.

First center frequency calculation module 44 is used to calculate the average of the first and second frequencies and uses it as the first center frequency of the digital signal.

Bandwidth determining module 45 is used to calculate the difference between the first and second frequencies and uses it as the bandwidth of the digital signal.

Specifically, the power determining module 42 determines the power value of the digital signal at the determined frequency according to the following equation and by using the fixed point count detected at the determined frequency of the digital signal:

$$P = \frac{1}{N}\sum_{n=1}^{N}(I_n^2 + Q_n^2)$$

P is the power value of the digital signal at the determined frequency step, N is the fixed point count of the digital signal, $I^2+Q^2$ is the power value of the digital signal at any frequency step, where I indicates the in-phase of the digital signal and Q indicates the quadrature of the digital signal.

The equipment also includes a linear filter 39. Linear filter 39 uses the difference between the first and second center frequency and the digital signal bandwidth value, as determined by the adaptation controller 32, as parameters for the linear filter performed on the digital signals generated from the down-converter and A/D converter 36.

The digital gain adjuster 35 also uses the digital gain attenuation for digital gain adjustment on the digital signal after the linear filter and output into the pre-distorter 37.

The digital pre-distorter 37 is also used for a digital pre-distortion operation on the signal resulting from the digital gain adjuster 35.

The RF power amplifier 38 is also used for a power amplification and output of the signal resulting from the digital pre-distortion operation of the digital pre-distorter 37.

Figure 7:
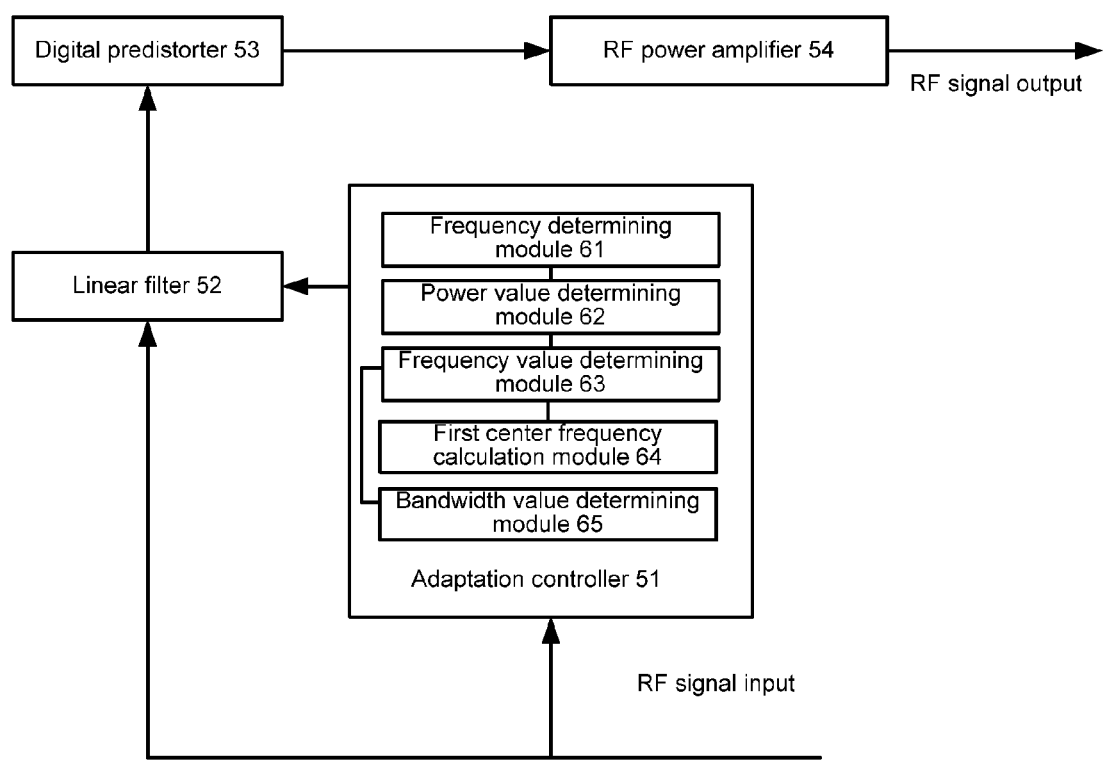
FIG. 7 is a schematic of the structure of the RF signal control device according to another embodiment of the invention.

FIG. 7 illustrates the structure of the RF signal control device according to another embodiment of the current invention. This embodiment describes the control device capable of implementing the RF signal control method according to the second embodiment described above. The RF signal control device of this embodiment further includes an adaptation controller 51, a linear filter 52, a digital pre-distorter 53, and an RF power amplifier 54.

Adaptation controller 51 is used for determining the first center frequency and bandwidth of the digital signal that is generated through the down-conversion and A/D conversion of the input RF signal and for determining the second center frequency of the working band required by the power amplifier 54 according to the start frequency and stop frequency of the power amplifier 54.

Linear filter 52 uses the difference between the first and second center frequency and the digital signal bandwidth value, as determined by the adaptation controller 51, as parameters for the linear filter 52 and output of the digital signals generated from the down-conversion and A/D conversion on the input RF signal.

Digital pre-distorter 53 is used for a digital pre-distortion operation on the signal after the adjustment of linear filter 52.

RF power amplifier 54 is used for power amplification and output of the digital signal after the pre-distortion operation.

Additionally, the monitor controller 51 also includes a frequency determining module 61, a power determining module 62, a frequency value determining module 63, a first center frequency calculation module 64, and a bandwidth determining module 65.

The frequency determining module 61 is used to determine the start frequency and stop frequency required for the power executions.

Power determining module 62 is used to determine the power values of the digital signals at different frequencies in steps from the determined start frequency to stop frequency.

Frequency determining module 63 is used to perform the following operations for the determined power values:

If the difference between the determined power value and the adjacent previous determined power value is greater than the pre-set threshold, the frequency determining module 63 decides whether such event occurs for the first time. If yes, the frequency when the difference is greater than the threshold is recorded as the first frequency.

If the difference between the determined power value and the adjacent previous determined power value is not greater than the pre-set threshold, the frequency determining module 63 decides whether such event occurs for the last time. If yes, the frequency when the difference is not greater than the threshold is recorded as the second frequency.

First center frequency calculation module 64 is used to calculate the average of the first and second frequencies and use it as the first center frequency of the digital signal.

Bandwidth determining module 65 is used to calculate the difference between the first and second frequencies and use it as the bandwidth of the digital signal.

Additionally, the power determining module 62 determines the power value of the digital signal at the determined frequency according to the following equation and by using the fixed point count detected at the determined frequency of the digital signal:

$$P = \frac{1}{N}\sum_{n=1}^{N}(I_n^2 + Q_n^2)$$

P is the power value of the digital signal at the determined frequency, N is the fixed point count of the digital signal, $I^2+Q^2$ is the power value of the digital signal at any frequency at a certain time, I indicates the in-phase of the digital signal and Q indicates the quadrature of the digital signal.

Figure 8:
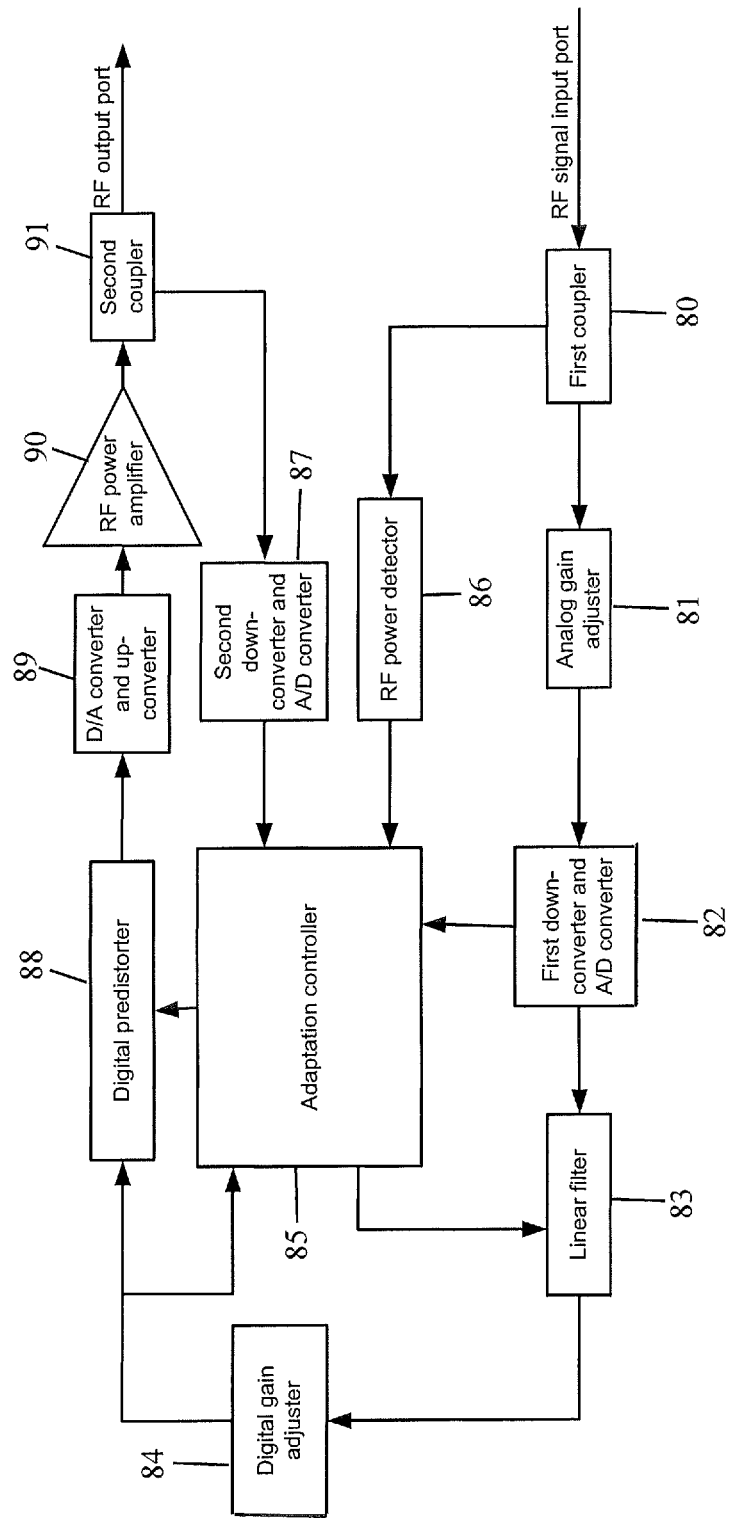
FIG. 8 is a schematic of the structure of the RF signal control system according to a different embodiment of the present invention.

FIG. 8 illustrates the structure of the RF signal control system according to another embodiment of the invention. The system includes the first coupler 80, an analog gain adjuster 81, a first down-converter and A/D converter 82, a linear filter 83, a digital gain adjuster 84, an adaptation controller 85, a RF power detector 86, a second down-converter and A/D converter 87, a digital pre-distorter 88, a D/A converter and up-converter 89, an RF power amplifier 90, and a second coupler 91.

The working principles of the system is described as below:

Step 1: The RF power detector gets an RF output signal via the first coupler and determines the voltage of the RF input signal. The adaptation controller uses the determined voltage to determine the analog gain attenuation by using the method of previously discussed embodiments, and sends it to the analog gain adjuster.

Step 2: The RF input signal enters into the analog gain adjuster via the first coupler. The analog gain adjuster decreases the RF signal by an analog gain attenuation value, and then the RF signal turns into one with analog gain adjustment.

Step 3: The adjusted RF signal passes through the first down-converter and A/D converter. According to the band-pass sampling theorem, the RF signal turns into an intermediate frequency (IF) digital baseband signal, and the IF digital baseband signal becomes a zero intermediate frequency (ZIF) digital baseband signal through the digital conversion and image rejection operations.

Here, the first down-converter and A/D converter is implemented with a dedicated component, and the digital conversion and image rejection operations are implemented with Field Programmable Gate Arrays (FPGA).

Step 4: The adaptation controller first determines the linear filter parameters according to the ZIF digital baseband signal by and sends the linear filter parameters to the linear filter.

The linear filter then performs linear filter improvement on the received ZIF digital baseband signal according to the determined linear filter parameters, which results in the digital baseband signal.

Optimally, when the adaptation controller determines the linear filter parameters through the ZIF digital baseband signal according to the method described in the embodiments above, the ZIF digital signal can pass a narrowband digital filter before the first down-converter and A/D converter send the ZIF digital baseband signal to the adaptation controller. The adaptation controller goes through the ZIF digital baseband signal by taking advantage of the features of the narrowband digital filter to filter out the digital signal, which results in the digital signal that passes through the band. The power value of the digital signal is also obtained by passing through the narrowband digital filter.

For example, the parameters of the narrowband digital filter can be set with passband of 30 kHz and sideband suppression of 40 dB.

Step 5: The digital gain adjuster adjusts the digital baseband signal after the linear filter by using the digital gain attenuation value and produces the digital signal suitable for subsequent operations.

Step 6: The digital signal suitable for subsequent operations enters into the digital pre-distorter, which implements correction on the digital signal by using the digital pre-distortion parameters.

The digital pre-distorter can be a special chip or implemented with at least one FPGA.

Step 7: The signal after the digital pre-distortion operation passes through the D/A converter and up-converter, where the digital signal turns into analog signal, and then analog signal turns into an RF signal through the up-converter.

Step 8: In the RF power amplifier, the RF signal is output via the second coupler.

After the RF signal is outputted, the RF signal collected by the second coupler is used as a feedback signal. Through the second down-converter and A/D converter, it turns into an analog IF signal after down-conversion, and then the analog IF signal is turned into an IF digital baseband signal.

The adaptation controller processes the received IF digital baseband signal through down conversion and filter operations, and produces a ZIF digital baseband signal. The signal subtracts the ZIF digital baseband signal in step 3, and the difference is used as the digital pre-distortion adjustment parameter.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A radio frequency (RF) signal control method, comprising:
    identifying a parameter information of an input RF signal, wherein said parameter information is used to characterize an input power value of the input RF signal;
    determining the input power value corresponding to the parameter information of the input RF signal according to a mapping relationship between the input RF signal parameter information and the input power value;
    adjusting a current gain attenuation value when the input power value is lower than a rating power value;
    adjusting and outputting the input RF signal using an adjusted gain attenuation value; and
    wherein the current gain attenuation value includes an analog gain attenuation value, the current gain attenuation will be adjusted by:
    determining a difference between the input power value corresponding to the parameter information and the rating power value;

determining a decrement for the analog gain attenuation value according to the pre-set mapping relationship between the difference and an analog gain attenuation decrement; and decreasing the analog gain attenuation value by the decrement to produce a new analog gain attenuation value.

2. The method according to claim 1, wherein the current gain attenuation value includes a digital gain attenuation value, the current gain attenuation will be adjusted by:

determining a difference between the input power value corresponding to the parameter information and the rating power value;

determining an increment of the digital gain attenuation value according to the pre-set mapping relationship between the difference and an digital gain attenuation increment, and increasing the digital gain attenuation value by the increment to produce a new digital gain attenuation value.

3. The method according to claim 2, wherein determining the increment of the digital gain attenuation value corresponding to the determined difference comprises:

determining increments for an in-phase I-channel attenuation and a quadrature Q-channel attenuation of the digital gain attenuation value as 1√2 of the difference, respectively.

4. The method according to claim 2 wherein adjusting and outputting the input RF signal using the adjusted gain attenuation value comprises:

adjusting the input RF signal using the adjusted gain attenuation value and outputting an adjusted digital signal after a digital pre-distortion and power amplification operation is performed on the adjusted input RF signal; and after the down-conversion and A/D conversion results in the digital signal and before the adjustment on the digital signal by using the new digital gain attenuation value.

5. The method according to claim 4 wherein determining the first center frequency and the bandwidth of digital signal comprises:

determining the start frequency and stop frequency required for the operation of the power amplifier, determining power values of the digital signal at different frequencies in pre-set steps from the start frequency to the stop frequency, for the power values determined for each pre-set step, the following operations are performed:

if the difference between the determined power value and an adjacent previous determined power value is greater than a pre-set threshold, decide whether such event occurs for the first time; if yes, then use the frequency corresponding to this determined power value as a first frequency, if the difference between the determined power value and the adjacent previous determined power value is not greater than the pre-set threshold, decide whether such event occurs for the last time; if yes, then use the frequency corresponding to this determined power value as a second frequency, use an average of the first and second frequencies as the first center frequency of the digital signal and the difference between the first and second frequencies as the bandwidth of the digital signal.

6. The method according to claim 5, wherein the power value of the digital signal at different frequency steps is determined as follows:

at any determined frequency step, a fixed point count of the digital signal is obtained and the power value of the digital signal at the determined frequency step is calculated according to the following equation:

$$P = \frac{1}{N}\sum_{n=1}^{N}(I_n^2 + Q_n^2)$$

wherein P is the power value of the digital signal at the determined frequency step, N is the fixed point count of the digital signal, $I^2 + Q^2$ is the power value of the digital signal at any frequency step, I indicates the in-phase of the digital signal and Q indicates the quadrature of the digital signal.

7. The method according to claim 2, wherein adjusting the input RF signal using the adjusted gain attenuation value comprises:

performing an analog gain adjustment on the input RF signal using the new analog gain attenuation value, conducting down-conversion and analog-to-digital (A/D) conversion on a RF signal with analog gain adjustment to result in a digital signal, and adjusting the digital signal by using the new digital gain attenuation value.

8. The method according to claim 4, wherein the method further comprises:

determining a first center frequency and a bandwidth of the digital signal;

determining a second center frequency of a working band required by a power amplifier according to an average value of a start frequency and a stop frequency required by the power amplifier;

using a difference between the first and second center frequencies and the bandwidth of the digital signal as parameters to implement a linear filter on the digital signals.

9. A radio frequency (RF) signal control method, comprising:

determining a first center frequency and a bandwidth of a digital signal that is generated through a down-conversion and analog-to-digital (A/D) conversion on an input RF signal;

determining a second center frequency of a working band required by a power amplifier according to a start frequency and a stop frequency of the power amplifier;

using a difference between the first and second center frequencies and the bandwidth of the digital signal as parameters to implement a linear filter on a plurality of digital signals, and generating outputs through digital pre-distortion and power amplifier operations.

10. The method according to claim 9, wherein determining the first center frequency and the bandwidth of the digital signal comprises:

determining the start frequency and stop frequency required for the operation of the power amplifier;

determining power values of at least one of the digital signals at different frequencies in steps from the start frequency to the stop frequency; and for the power values determined for each step, the following operations are performed:

if the difference between the determined power value and an adjacent previous determined power value is greater than a pre-set threshold, decide whether such event occurs for the first time; if yes, then use the frequency corresponding to this determined power value as a first frequency;

if the difference between the determined power value and the adjacent previous determined power value is not greater than the pre-set threshold, then decide whether such event occurs for the last time; if yes, use the frequency corresponding to this determined power value as a second frequency;

use an average of the first and second frequencies as the first center frequency of the digital signal and the difference between the first and second frequencies as the bandwidth of the digital signal.

11. The method according to claim 10, wherein the power value of the digital signal at different frequency steps is determined as follows:

at any determined frequency step, a fixed point count of the digital signal is obtained and the power value of the digital signal at the determined frequency is calculated according to the following equation:

$$P = \frac{1}{N}\sum_{n=1}^{N}(I_n^2 + Q_n^2)$$

wherein P is the power value of the digital signal at the determined frequency step, N is the fixed point count of the digital signal, $I^2 + Q^2$ is the power value of the digital signal at any frequency step, I indicates the in-phase of the digital signal and Q indicates the quadrature of the digital signal.

12. A radio frequency (RF) signal output device, comprising:

an RF power detector configured to identify a parameter information of an input RF signal, wherein said parameter information is used to characterize an input power value of the input RF signal;

an adaptation controller configured to determine the input power value corresponding to the parameter information of the input RF input signal as determined by the RF power detector according to a mapping relationship between the input RF signal parameter information and the input power value, wherein the adaptation controller is further configured to adjust a current gain attenuation value when it decides that the input power value is below a rating power value and send an adjusted gain attenuation value to a gain adjuster;

the gain adjuster is configured to adjust the input RF signal using the adjusted gain attenuation value and output the input RF input signal; and wherein the adaptation controller is configured to:

determine a difference between the input power value corresponding to the parameter information and the rating power value when the gain adjuster includes an analog gain adjuster;

use a pre-set mapping relationship between the difference and a decrement of an analog gain attenuation value to determine the analog gain attenuation decrement value; and get a new analog gain attenuation value from the determined decrement on a current analog gain attenuation.

13. The RF signal output device according to claim 12, further comprising a down-converter and A/D converter;

wherein the adaptation controller is further configured to:

determine a difference between the input power value corresponding to the parameter information and the rating power value when the gain adjuster includes a digital gain adjuster, use a pre-set mapping relationship between the difference and an increment of a digital gain attenuation value to determine a digital gain attenuation increment value, and get a new digital gain attenuation value from the determined increment on a current digital gain attenuation.

14. The RF signal output device according to claim 13, further comprising:

an RF power amplifier configured to use power amplification on the signal resulting from the digital pre-distortion operation and output on the resulting signal; and a digital pre-distorter configured to use a digital pre-distortion operation on the digital signal resulting from the digital gain adjuster.

15. The RF signal output device according to claim 13, wherein the analog gain adjuster is configured to use the analog gain adjustment value on the input RF signal using the new analog gain attenuation value to produce at least one digital signal.

16. The RF signal output device according to claim 13, wherein the down-converter and A/D converter is configured to use a down-conversion and A/D conversion on the digital signal produced by the analog gain adjuster.

17. The RF signal output device according to claim 13, wherein the digital gain adjuster is further configured to use the adjustment on the digital signal resulting from the down-converter and A/D converter by using the new digital gain attenuation value.

18. The RF signal output device according to claim 14, wherein the adaptation controller is further configured to:

determine the first center frequency and the bandwidth of the digital signal after the down-conversion and A/D conversion to produce the digital signal and before the adjustment on the digital signal by using the digital gain adjuster, and determine the second center frequency of the RF power amplifier working band according to the average of the start frequency and stop frequency as required for the operation of the power amplifier.

19. The RF signal output device according to claim 14, wherein the RF signal output device further comprises:

a linear filter configured to use the difference between the first and second center frequency and the digital signal bandwidth value, as determined by the adaptation controller, as parameters to implement a linear filter on the digital signals generated from the down-converter and A/D converter.

20. A radio frequency (RF) signal output device, comprising:

an adaptation controller configured to:

determine a first center frequency and a bandwidth of a digital signal that is generated through a down-conversion and analog-to-digital (A/D) conversion of an input RF signal, and determine a second center frequency of a working band required by a power amplifier according to a start frequency and a stop frequency of the power amplifier;

a linear filter configured to use a difference between the first and second center frequencies and the bandwidth of the digital signal, as determined by the adaptation controller, as parameters of to implement the linear filter on at least one of the digital signals generated from the down-conversion and A/D conversion on the input RF signal;

a digital pre-distorter configured to use a digital pre-distortion operation on the digital signals after the adjustment of by the linear filter;

an RF power amplifier configured to use power amplification after the pre-distortion operation and output the resulting signal.

21. The RF signal output device according to claim 20 wherein the adaptation controller further comprises:

a frequency determining module configured to determine the start frequency and the stop frequency required for the power amplifications;

a power determining module configured to determine power values of at least one of the digital signals at different frequencies in steps from the start frequency to stop frequency.

22. The RF signal output device according to claim 21 wherein the power determining module determines the power value of the digital signal at the determined frequency steps according to the following equation and by using the fixed point count detected at the determined frequency of the digital signal:

$$P = \frac{1}{N} \sum_{n=1}^{N} (I_n^2 + Q_n^2)$$

wherein P is the power value of the digital signal at the determined frequency step, N is the fixed point count of the digital signal, $I^2 + Q^2$ is the power value of the digital signal at any frequency step, I indicates the in-phase of the digital signal and Q indicates the quadrature of the digital signal.

23. The RF signal output device according to claim 21, wherein the frequency determining module is configured to perform the following operations for the determined power values:

if the difference between the determined power value and an adjacent previous determined power value is greater than a pre-set threshold, then decide whether such event occurs for the first time; if yes, then use the frequency corresponding to this determined power value as a first frequency;

if the difference between the determined power value and the adjacent previous determined power value is not greater than the pre-set threshold, then decide whether such event occurs for the last time; if yes, then use the frequency corresponding to this determined power value as a second frequency.

* * * * *